(12) United States Patent
Ma et al.

(10) Patent No.: US 6,716,050 B1
(45) Date of Patent: Apr. 6, 2004

(54) LAND GRID ARRAY CONNECTOR ASSEMBLY HAVING A STIFFENER WITH PIVOT BORES

(75) Inventors: Hao-Yun Ma, Tu-chen (TW); Ming-Lun Szu, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/453,220

(22) Filed: Jun. 2, 2003

(30) Foreign Application Priority Data

Dec. 20, 2002 (TW) ........................ 91220815 U

(51) Int. Cl.$^7$ .............................................. H01R 13/62
(52) U.S. Cl. ............................................ 439/331; 439/73
(58) Field of Search .................................. 439/330, 331, 439/264, 68–73, 342, 66

(56) References Cited

U.S. PATENT DOCUMENTS

| | | | | |
|---|---|---|---|---|
| 4,345,810 A | * | 8/1982 | Bakermans | 439/71 |
| 4,456,318 A | * | 6/1984 | Shibata et al. | 439/68 |
| 4,502,747 A | * | 3/1985 | Bright et al. | 439/296 |
| 4,504,105 A | * | 3/1985 | Barkus et al. | 439/331 |
| 4,515,424 A | * | 5/1985 | Sakurai | 439/325 |
| 4,515,425 A | * | 5/1985 | Nakano | 439/73 |
| 4,553,805 A | * | 11/1985 | Aikens | 439/325 |
| 4,560,216 A | * | 12/1985 | Egawa | 439/41 |
| 4,560,217 A | * | 12/1985 | Siano | 439/68 |
| 4,601,525 A | * | 7/1986 | Kandybowski | 439/329 |
| 4,715,835 A | * | 12/1987 | Matsuoka | 439/893 |
| 4,760,161 A | * | 7/1988 | Durette et al. | 560/8 |
| 4,761,140 A | * | 8/1988 | Geib | 439/71 |
| 5,009,608 A | * | 4/1991 | Shipe | 439/331 |
| 5,109,980 A | * | 5/1992 | Matsuoka et al. | 206/724 |
| 5,120,238 A | * | 6/1992 | Marks et al. | 439/331 |
| 5,241,453 A | * | 8/1993 | Bright et al. | 361/704 |
| 5,244,404 A | * | 9/1993 | Kishi et al. | 439/331 |
| 5,302,853 A | * | 4/1994 | Volz et al. | 257/707 |
| 5,344,334 A | * | 9/1994 | Laub et al. | 439/331 |
| 5,387,120 A | * | 2/1995 | Marks et al. | 439/331 |
| 5,485,351 A | * | 1/1996 | Hopfer et al. | 361/704 |
| 5,669,784 A | * | 9/1997 | Ito et al. | 439/331 |
| 5,761,036 A | * | 6/1998 | Hopfer et al. | 361/704 |
| 6,244,875 B1 | * | 6/2001 | McHugh et al. | 439/73 |

* cited by examiner

*Primary Examiner*—Ross Gushi
(74) *Attorney, Agent, or Firm*—Wei Te Chung

(57) ABSTRACT

A land grid array (LGA) connector assembly (1) includes a base (11), a stiffener (13) mounted to the base, and a lever (12) and a metal clip (14) pivotally mounted to two opposite ends of the base and engaging with each other. The base has a forewall (116). The stiffener includes two flanges (132) covering two opposite lateral sides of the base. The ends of the flanges and the forewall of the base cooperatively define a channel. Each flange defines a pivot bore (1321) at an end of the channel. The lever is received in the channel, with pivoting in the pivot bores. Thus, when the lever are rotated to firmly attach a CPU in the LGA connector assembly, the base can withstand forces from the clip without any deformation and warpage, and the lever is reliably retained in the channel with minimal risk of breaking out from the channel.

16 Claims, 4 Drawing Sheets

LAND GRID ARRAY CONNECTOR ASSEMBLY HAVING A STIFFENER WITH PIVOT BORES

BACKGROUND OF THE INVENTION

1. Field of the Invention

The present invention relates to land grid array (LGA) connector assemblies, and particularly to an LGA connector assembly adapted for receiving an LGA central processing unit (CPU) therein and electrically connecting the CPU with a printed circuit board (PCB).

2. Description of the Prior Art

Referring to FIG. 3, a conventional LGA connector assembly 9 is adapted for electrically connecting an LGA CPU (not shown) having a multiplicity of metallic contact pads with a PCB (not shown). The LGA connector assembly 9 comprises an insulative base 91 receiving a plurality of electrical contacts (not shown), and a lever 92 and a metal clip 93 pivotally mounted to two opposite ends of the base 91 respectively.

The lever 92 comprises a pair of locating portions 922, an offset securing portion 921 between the locating portions 922, and a handle portion 923 extending perpendicularly from an end of one of the locating portions 922. The clip 93 comprises a lip 931 at an end thereof, and a pair of spaced mounting portions 932 extending arcuately from an opposite end thereof.

The base 91 defines a rectangular cavity 911 in a middle thereof, a pair of spaced slots 912 at one end thereof, and a trapezoidal recess 913 at an opposite end thereof. The base has a forewall 914. The cavity 911 is adapted for receiving the CPU therein. A multiplicity of passageways (not shown) is defined in a portion of the base 91 under the cavity 911, the passageways receiving a corresponding number of the contacts therein, respectively. Also referring to FIG. 4, the mounting portions 932 of the clip 93 are received in the corresponding slots 912, to pivotally mount the clip 93 to the base 91. The base 91 comprises two spaced upper ears 917 extending from an upper section of the forewall 914, two spaced lower ears 918 extending from a lower section of the forewall 914, and a pair of blocks 915 each mounted to a respective one of the lower ears 918. The upper and lower ears 917, 918 cooperatively define a channel 916 therebetween, the channel 916 being in communication with the recess 913. The locating portions 922 of the lever 92 are received in the channel 916, and the securing portion 921 of the lever 92 is received in the recess 913. The blocks 915 are mounted to the corresponding lower ears 917 to retain the locating portions 922 within the channel 916.

In use, the base 91 is mounted to and electrically connected with the PCB. The clip 93 and the handle portion 923 of the lever 92 are oriented perpendicular to the base 91, with the securing portion 921 disposed above the locating portions 922. The CPU is mounted in the cavity 911, with the metallic contact pads of the CPU loosely attached on the corresponding contacts of the base 9. The clip 93 is rotated down to loosely contact the CPU. The handle portion 923 is rotated downwardly, thus rotating the securing portion 921 downwardly. The securing portion 921 contacts the lip 931 of the clip 93 and presses the lip 931 downwardly. When the handle portion 923 has reached a horizontal position, the securing portion 921 is tightly engaged with the lip 931, and the metallic contact pads of the CPU are firmly attached on the contacts of the base 91. The LGA connector assembly 9 thus electrically connects the CPU with the PCB.

With the prevailing trend toward miniaturization of computers, the sizes of LGA connector assemblies used in computers are steadily becoming smaller. In contrast, the number of contacts used in LGA connectors is increasing to meet the need for more signal transmission. These considerations bear on the conventional LGA connector assembly 9 as follows. During the rotation of the lever 92 to force the metallic contact pads of the CPU on the contacts of the base 91, the metal clip 93 and the lever 92 exert forces on the base 91. The forces acting on portions of the base 91 near the slots 912 and at the channel 916 are greater than those acting on other portions of the base 91. Therefore the base 91 is liable to deform and warp. When deformation or warpage occurs, some contacts cannot firmly contact the metallic contact pads of the CPU, which disrupts the electrical connection between the CPU and the PCB.

In addition, the upper and lower ears 917, 918 are thinner than other portions of the base 91, and are typically made of non-rigid insulative material such as plastic. When the lever 92 is rotated downwardly to press the lip 931 downwardly, the upper ears 917 and/or the lower ears 918 are liable to deform and warp due to compression from the locating portions 922 of the lever 92. When deformation or warpage occurs, the lever 92 is liable to break out from the channel 916.

A new LGA connector assembly that overcomes the above-mentioned disadvantages is desired.

SUMMARY OF THE INVENTION

Accordingly, an object of the present invention is to provide a land grid array (LGA) connector assembly for electrically connecting an electronic package such as an LGA central processing unit (CPU) with a circuit substrate such as a printed circuit board (PCB), wherein the LGA connector assembly has a base that resists deformation and warpage.

Another object of the present invention is to provide an LGA connector assembly which has a lever mechanism configured to minimize the risk of the lever breaking out from the LGA connector assembly in use.

To achieve the above-mentioned objects, an LGA connector assembly in accordance with a preferred embodiment of the present invention comprises an insulative base, a stiffener mounted to the base, a lever pivotally mounted to one end of the base, and a metal clip pivotally mounted to an opposite end of the base for engaging with the lever. The base defines a rectangular cavity in a middle thereof and a plurality of rectangular holes in two opposite lateral sides thereof. The base has a forewall at an end thereof. The stiffener comprises a pair of metal reinforcing members covering the opposite lateral sides of the base. Each reinforcing member comprises a top portion, a flange depending perpendicularly from an outside edge of the top portion, and three projecting portion depending perpendicularly from an opposite inner edge of the top portion for engaging with the holes of the base. When the reinforcing members are mounted to the base, the ends of the flanges and the forewall of the base cooperatively define a channel. Each of the flanges defines a pivot bore at an end of the channel. The lever is received in the channel with pivoting in the pivot bores of the reinforcing members. Thus, when the lever and the clip are rotated to tightly attach a CPU in the LGA connector assembly, the base is able to withstand forces from the clip without any deformation and warpage, and the lever is reliably retained in the channel with minimal risk of breaking out from the channel.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 1:
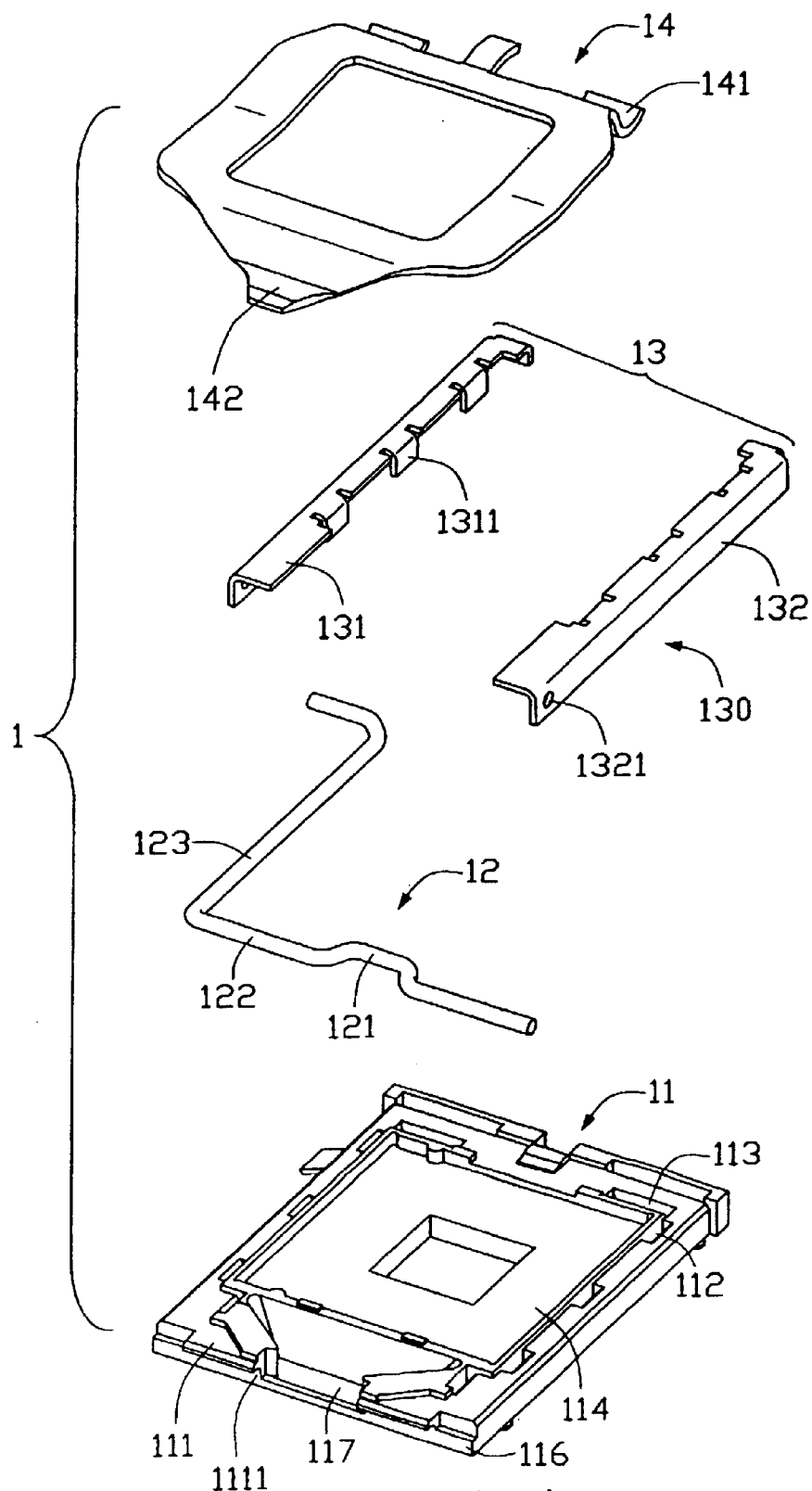
FIG. 1 is an exploded, isometric view of an LGA connector assembly of the present invention.

Referring to FIG. 1, an LGA connector assembly 1 in accordance with the preferred embodiment of the present invention is adapted for electrically connecting an electronic package, such as an LGA central processing unit (CPU) (not shown), with a circuit substrate, such as a printed circuit board (PCB) (not shown). The LGA connector assembly 1 comprises an insulative base 11 receiving a plurality of electrical contacts (not shown), a stiffener 13 mounted to the base 11, and a lever 12 and a metal clip 14 pivotally mounted to two opposite ends of the base 11 respectively.

The base 11 is substantially rectangular. The base 11 defines a pair of spaced, aligned slots 113 in one end thereof, a trapezoidal recess 117 in an opposite end thereof, and a rectangular cavity 114 between the slots 113 and the recess 117. The base 11 has a forewall 116. A pair of spaced upper ears 111 extends from an upper section of the forewall 116. A multiplicity of passageways (not shown) is defined in a portion of the base 11 under the cavity 114, the passageways receiving a corresponding number of the contacts therein, respectively. Six spaced rectangular holes 112 are defined in opposite lateral sides of the base 11 respectively, near the cavity 114.

The clip 14 comprises a pair of spaced mounting portions 141 at an end thereof, and a lip 142 at an opposite end thereof.

The lever 12 comprises a pair of locating portions 122, an offset securing portion 121 between the locating portions 122, and a handle portion 123 extending perpendicularly from an end of one of the locating portions 122.

The stiffener 13 comprises a pair of metal reinforcing members 130 respectively covering the opposite lateral sides of the base 111. Each reinforcing member 130 has an L-shaped profile, and comprises: a top portion 131; a flange 132 depending perpendicularly from an outside edge of the top portion 131; and three projecting portions 1311 depending perpendicularly from an opposite inner edge of the top portion 131, corresponding to respective holes 112 of the base 11. Each flange 132 defines a pivot bore 1321 at an end thereof. When the reinforcing members 130 are mounted to the base 11, the ends of the flanges 132 and the forewall 116 and upper ears 111 of the base 11 cooperatively define a channel 1111 therebetween.

In assembling the reinforcing members 130, the lever 12 and the clip 14 to the base 11, the lever 12 is passed through the pivot bore 1321 of one reinforcing member 130, and an end of the locating portion 122 that is adjacent the handle portion 123 is received in the pivot bore 1321 of said one reinforcing member 130. An end of the other locating portion 122 is received within the pivot bore 1321 of the other reinforcing member 130. The reinforcing members 130 and the lever 12 are attached on the base 11, with the projecting portions 1311 of the reinforcing members 130 being partly received in or aligned with the corresponding holes 112 of the base 11, and the locating portions 122 of the lever 12 resting on tops of the upper ears 111. The reinforcing members 130 and the lever 12 are pressed downwardly, and the upper ears 111 undergo elastical deformation. The locating portions 122 of the lever 12 are snappingly received in the channel 1111, the top portions 131 of the reinforcing members 130 abut against tops of the lateral sides of the base 11, and the projecting portions 1311 are fittingly engaged in the corresponding holes 112. Then, the mounting portions 141 of the clip 14 are received in the slots 112 of the base 11 to pivotably mount the clip 14 to the base 11.

In use, the LGA connector assembly 1 is mounted to and electrically connected with the PCB. The clip 14 and the handle portion 123 of the lever 12 are each oriented perpendicular to the base 11, with the securing portion 121 of the lever 12 disposed over the locating portions 122. The CPU is received in the cavity 114 of the base 11, with metallic contact pads of the CPU loosely attached on the corresponding contacts of the base 11. The clip 14 is rotated downwardly to loosely contact the CPU. The lever 12 is rotated downwardly, with the locating portions 122 pivoting in the pivot bores 1321 of the reinforcing members 130. Once the securing portion 121 of the lever 12 contacts the lip 142 of the clip 14, the securing portion 121 begins to press the lip 142 downwardly. When the handle portion 123 has reached a horizontal position, the securing portion 121 tightly engages with the lip 142. Thus, the clip 14 firmly presses the CPU in the cavity 114, and the CPU is electrically connected with the PCB securely.

Figure 2:
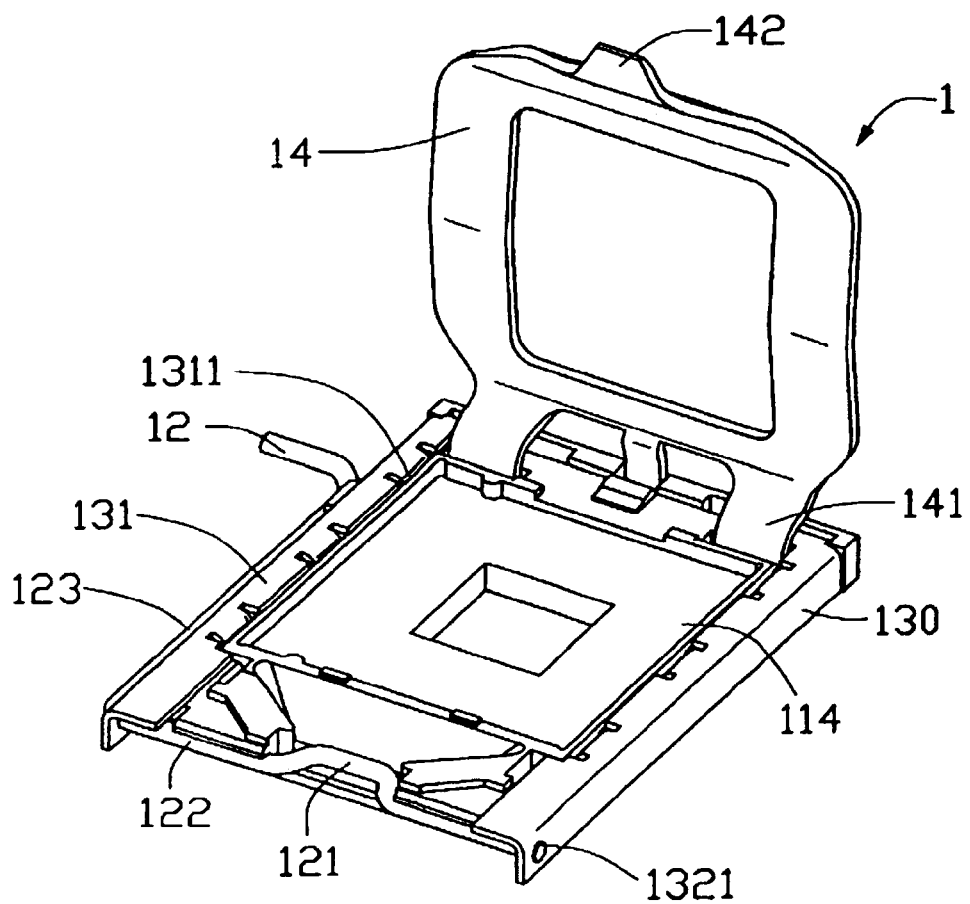
FIG. 2 is an assembled view of FIG. 1.
Figure 3:
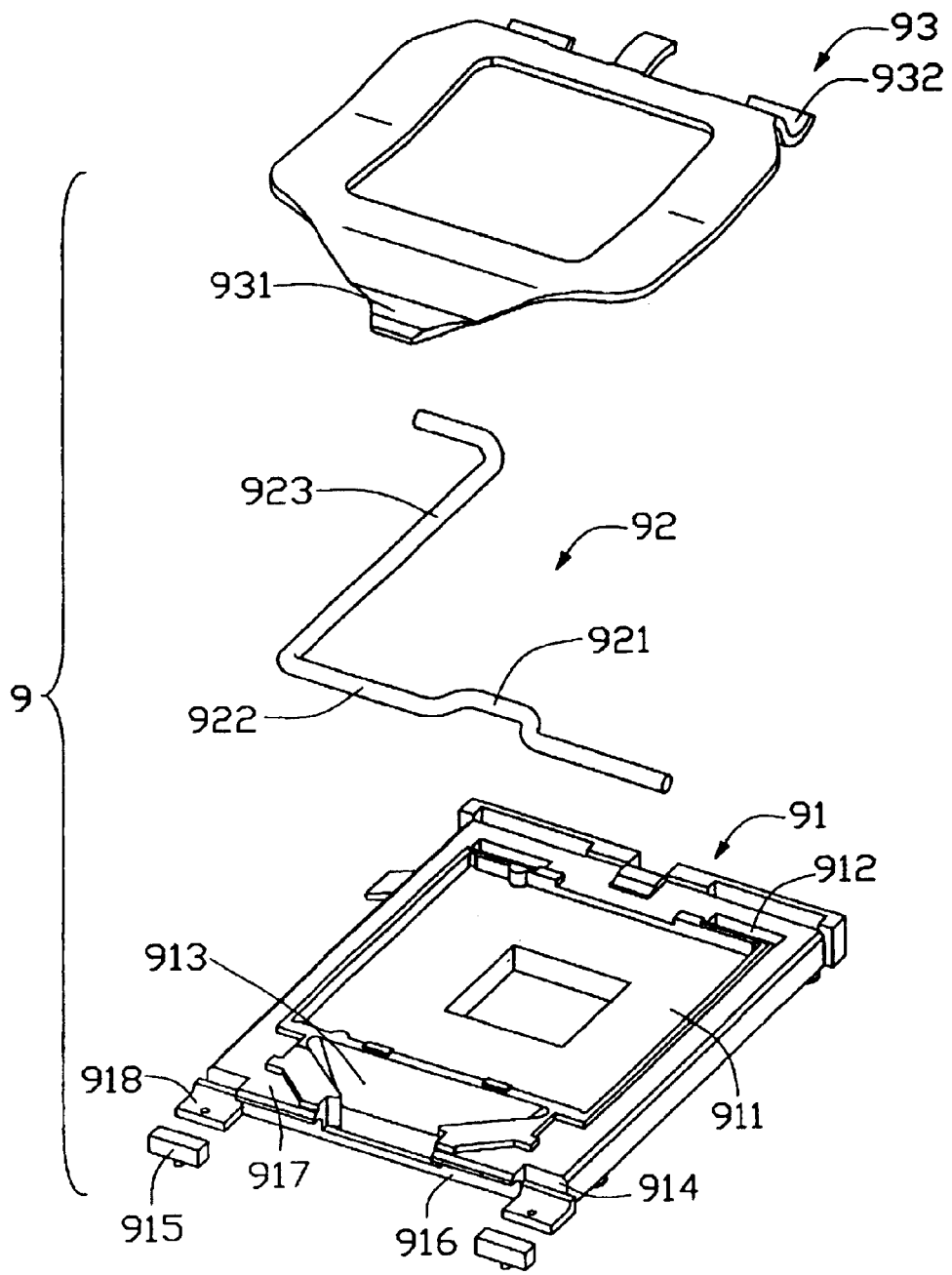
FIG. 3 is an exploded isometric view of a conventional LGA connector assembly.
Figure 4:
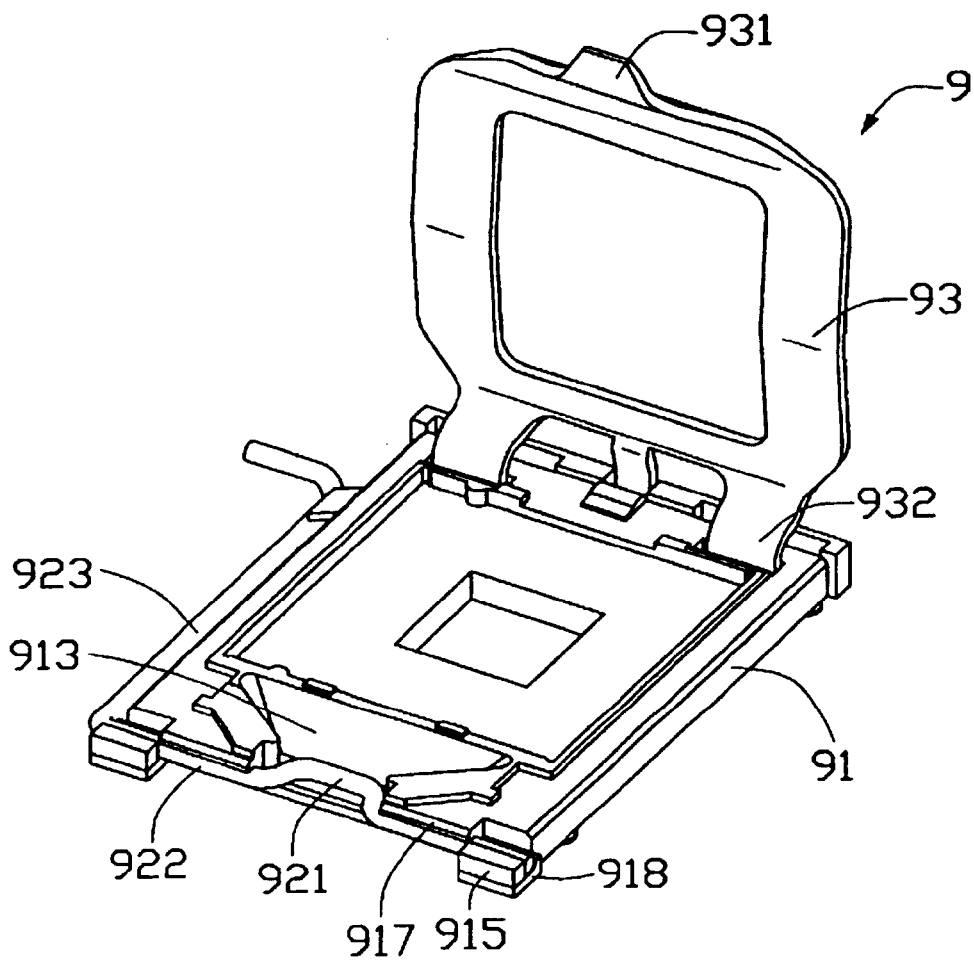
FIG. 4 is an assembled of FIG. 3.

As can be seen from FIG. 2, the reinforcing members 130 are mounted to the opposite lateral sides of the base 11 to reinforce the base 11. Thus, when the lever 13 and the clip 14 are rotated, even though portions of the base 11 near to the slots 113 and the forewall 116 sustain greater forces from the clip 14 than other portions of the base 11, the base 11 is able to withstand such forces. As a result, the base 11 resists deformation and warpage. In addition, when the lever 12 is rotated, the locating portions 122 thereof pivot in the pivot bores 1321 of the reinforcing members 130. Therefore when the securing portion 121 of the lever 12 pressingly engages on the lip 142 of the clip 14, said ends of the flanges 132 of the reinforcing members 130 bear some of the load from the locating portions 122 that would otherwise be completely borne by the upper ears 111 of the base 11. Therefore, the lever 12 is reliably retained in the channel 1111 with minimal risk of breaking out from the channel 1111.

while a preferred embodiment in accordance with the present invention has been shown and described, equivalent modifications and changes known to persons skilled in the art according to the spirit of the present invention are considered within the scope of the present invention as defined in the appended claims.

What is claimed is:

1. A land grid array (LGA) connector assembly, comprising:
    an insulative base defining a cavity in a middle thereof, and having a forewall;
    a metal stiffener mounted to the base and comprising two flanges covering two opposite lateral sides of the base, each flange defining a pivot bore at an end thereof, the forewall of the base and the two ends of the two flanges defining a channel therebetween, the pivot bores being located at opposite ends of the channel;

a lever pivotally received in the channel and engaging with the pivot bores of the stiffener; and a metal clip pivotally mounted to one end of the base to be engageable by the lever.

2. The LGA connector assembly as claimed in claim 1, wherein a pair of upper ears extends from an upper section of the forewall, and the lever is received under the upper ears.

3. The LGA connector assembly as claimed in claim 1, wherein the base defines a pair of slots in one end thereof.

4. The LGA connector assembly as claimed in claim 3, wherein the clip has a pair of mounting portions at an end thereof for being mounted in the slots of the base.

5. The LGA connector assembly as claimed in claim 1, wherein the stiffener comprises a pair of reinforcing members each having a top portion.

6. The LGA connector assembly as claimed in claim 5, wherein each of the flanges depends perpendicularly from an outside edge of the top portion of one of the reinforcing members.

7. The LGA connector assembly as claimed in claim 6, wherein a plurality of projecting portions depends perpendicularly from an opposite inner edge of the top portion.

8. The LGA connector assembly as claimed in claim 7, wherein the base defines a plurality of holes in two opposite later sides thereof for fittingly engaging with the projecting portions of the reinforcing members.

9. The LGA connector assembly as claimed in claim 1, wherein the lever comprises a pair of locating portions and an offset securing portion between the locating portions.

10. The LGA connector assembly as claimed in claim 9, wherein an end of each of the locating portions is received in the pivot bore of one of the flanges of the stiffener.

11. The LGA connector assembly as claimed in claim 9, wherein the clip has a lip at a free end thereof for engaging with the securing portion of the lever.

12. The LGA connector assembly as claimed in claim 9, wherein the base defines a trapezoidal recess in one end thereof in communication with the channel for receiving the securing portion of the lever.

13. An electrical connector comprising:

an insulative housing defining opposite first and second ends along a lengthwise direction;

a metal clip pivotally mounted to the first end, the housing defining a slot adjacent to the first end and the clip defining a mounting portion receivably located in said slot; and a metal stiffener mounted to the housing and extending along said lengthwise direction, stiffener further including an end portion located around the slot to abut against the mounting portion when said clip is rotated from a vertical open position to a horizontal closed position.

14. The connector as claimed in claim 13, further including a lever pivotally mounted to the second end.

15. The connector as claimed in claim 14, wherein said lever includes a rotatable location portion engaged with the other end portion of said stiffener at least when said lever presses the clip downwardly.

16. An electrical connector comprising:

an insulative housing defining opposite first and second ends along a lengthwise direction;

a clip generally pivotally attached to the first end;

a lever pivotally mounted to the second end, said lever including a location portion rotatably received in a channel of the housing around said second end; and a metal stiffener mounted to the housing and extending along said lengthwise direction, stiffener further including an end portion located around the channel to abut against the location portion when said clip is downwardly pressed by said lever.

\* \* \* \* \*